(12) United States Patent
Matsumura et al.

(10) Patent No.: US 6,411,178 B1
(45) Date of Patent: Jun. 25, 2002

(54) MULTI-LAYER COMPOSITE ELECTRONIC COMPONENT

(75) Inventors: Sadayuki Matsumura, Takefu; Noboru Kato, Sabae; Hiroko Nomura, Fukui-ken, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/644,259

(22) Filed: Aug. 23, 2000

(30) Foreign Application Priority Data

Aug. 23, 1999 (JP) ............................. 11-236028
Dec. 17, 1999 (JP) ............................. 11-360019

(51) Int. Cl.$^7$ ............................................. H01P 1/213
(52) U.S. Cl. ........................................ 333/134; 333/185
(58) Field of Search ............................. 333/134, 126, 333/204, 185, 132, 175

(56) References Cited

U.S. PATENT DOCUMENTS 5,777,533 A * 7/1998 Kato et al. ................... 333/185
5,783,976 A * 7/1998 Furutani et al. ............. 333/134
5,880,649 A * 3/1999 Tai et al. ...................... 333/132

* cited by examiner

Primary Examiner—Robert Pascal
Assistant Examiner—Dean Takaoka
(74) Attorney, Agent, or Firm—Keating & Bennett, LLP

(57) ABSTRACT

A compact multi-layer composite electronic component is such that electric couplings occurring between a plurality of high-frequency circuits are reduced. In this compact multi-layer composite electronic component, the axes of the inductors of LC resonators defining a first band pass filter circuit (BPF 1) are disposed substantially perpendicularly to the axes of the inductors of LC resonators defining a second band pass filter circuit (BPF 2). The inductors of the LC resonators defining the BPF 1 are constituted by joining via-holes disposed on insulating sheets. The inductors of the LC resonators defining the BPF 2 are constituted of inductor patterns provided on the surfaces of specific ones of the insulating sheets.

22 Claims, 6 Drawing Sheets

MULTI-LAYER COMPOSITE ELECTRONIC COMPONENT

BACKGROUND OF THE INVENTION

1. Field of the Invention

The present invention relates to multi-layer composite electronic components such as multi-layer duplexers, multi-layer triplexers, multi-layer diplexers, and multi-layer filter arrays, which are constructed for use in microwave bands.

2. Description of the Related Art

A conventional multi-layer composite electronic component has a structure shown in each of FIGS. 9 and 10. As shown in FIG. 9, a multi-layer composite electronic component 1 includes a ceramic sheet 6 having inductor patterns 12 to 17 disposed thereon, a ceramic sheet 7 having capacitor patterns 18 to 23 disposed thereon, a ceramic sheet 5 having coupling capacitor patterns 24 to 27 disposed thereon, a ceramic sheet 3 having shield patterns 28a and 29a disposed thereon, and a ceramic sheet 9 having shield patterns 28b and 29b disposed thereon.

On the left-half region of the duplexer 1, a three-stage band pass filter circuit BPF 1 including LC resonators Q1 to Q3, is provided. On the right-half region of the duplexer 1, a three-stage band pass filter circuit BPF 2 including LC resonators Q4 to Q6, is provided. Inductors L1 to L6 of the LC resonators Q1 to Q6 are defined by inductor patterns 12, 13, 14, 15, 16, and 17. Capacitors C1 to C6 of the LC resonators Q1 to Q6 are defined by capacitor patterns 18, 19, 20, 21, 22, 23 and the top-end portions of the inductor patterns 12, 13, 14, 15, 16, and 17 opposing the capacitor patterns 18 to 23.

In addition, the LC resonators Q1 to Q3 of the band pass filter circuit BPF 1 are electrically coupled by coupling capacitors Cs1 and Cs2 defined by the inductor patterns 12 to 14 and coupling capacitor patterns 24 and 25 opposing the inductor patterns 12 to 14. Shield patterns 28a and 28b are provided with the patterns 12 to 14, 18 to 20, 24, and 25, disposed therebetween. Similarly, the LC resonators Q4 to Q6 of the band pass filter circuit BPF 2 are electrically coupled by coupling capacitors Cs3 and Cs4 defined by the inductor patterns 15 to 17 and coupling capacitor patterns 26 and 27 opposing the inductor patterns 15 to 17. Furthermore, shield patterns 29a and 29b are arranged with the patterns 15 to 17, 21 to 23, 26, and 27 disposed therebetween.

As shown in FIG. 10, a multi-layer body 35 formed by laminating ceramic sheets 2 to 9 includes a transmission terminal electrode Tx, a reception terminal electrode Rx, an antenna: terminal electrode ANT, and ground terminal electrodes G1 to G4. The transmission terminal electrode Tx is connected to the inductor pattern 12 of the LC resonator Q1, the reception terminal electrode Rx is connected to the inductor pattern 17 of the LC resonator Q6, and the antenna terminal electrode ANT is connected to the inductor patterns 14 and 15 of the LC resonators Q3 and Q4, respectively. The ground terminal electrodes G1 and G2 are connected to one end of each of the inductor patterns 12 to 14 and one end of each of the capacitor patterns 18 to 20 of the LC resonators Q1 to Q3. The ground electrodes G3 and G4 are connected to one end of each of the inductor patterns 15 to 17 and one end of the capacitor patterns 21 to 23 of the LC resonators Q4 to Q6.

Meanwhile, in the conventional duplexer 1, the inductor patterns 12 to 14 constituting the band pass filter circuit BPF 1 and the inductor patterns 15 to 17 constituting the band pass filter circuit BPF 2 are arranged parallel to each other on the same plane of the ceramic sheet 6. With this arrangement, magnetic field components generated on the inductor patterns 12 to 14 and magnetic field components generated on the inductor patterns 15 to 17 are also parallel to each other. As a result, the band pass filter circuits BPFs 1 and 2 tend to be electrically coupled with each other, thereby leading to changes in the filter characteristics of the band pass filter circuits BPFs 1 and 2.

In order to prevent the above problems, it is necessary to increase the space between the band pass filter circuits BPFs 1 and 2, or it is necessary to dispose a shield pattern between the band pass filter circuits BPFs 1 and 2. However, such measures are not effective enough to reduce the electric coupling between the band pass filter circuits BPFs 1 and 2, and another problem such as an increase in the size of the duplexer 1 is caused due to the extra space or the shield pattern.

SUMMARY OF THE INVENTION

To overcome the problems described above, preferred embodiments of the present invention provide a compact multi-layer composite electronic component in which electric couplings between a plurality of high-frequency circuits contain ed therein are greatly reduced.

To this end, according to one preferred embodiment of the present invention, there is provided a multi-layer composite electronic component including (1) a multi-layer body defined by laminating a plurality of insulating layers, a plurality of inductor conductors, and a plurality of capacitor conductors, (2) a first high-frequency circuit having a plurality of LC resonators including a plurality of inductors defined by the inductor conductors and a plurality of capacitors defined by the capacitor conductors, and (3) a second high-frequency circuit having a plurality of LC resonators including a plurality of inductors defined by the inductor conductors and a plurality of capacitors defined by the capacitor conductors. In this multi-layer composite electronic component, at least one of the inductors of the first high-frequency circuit is disposed substantially perpendicularly to at least one of the inductors of the second high-frequency circuit.

Since at least one of the inductors of the first high-frequency circuit is arranged substantially perpendicularly to at least one of the inductors of the second high-frequency circuit, the magnetic-field components generated around each of the inductors are also substantially perpendicular to each other. As a result, the electric couplings between the inductors are minimized.

Other features, elements, characteristics and advantages of present invention will become apparent from the following detailed description of preferred embodiments thereof with reference to the attached drawings.

DETAILED DESCRIPTION OF PREFERRED EMBODIMENTS

Referring to the attached drawings, a description will be provided of preferred embodiments of a multi-layer composite electronic component according to the present invention.

Figure 1:
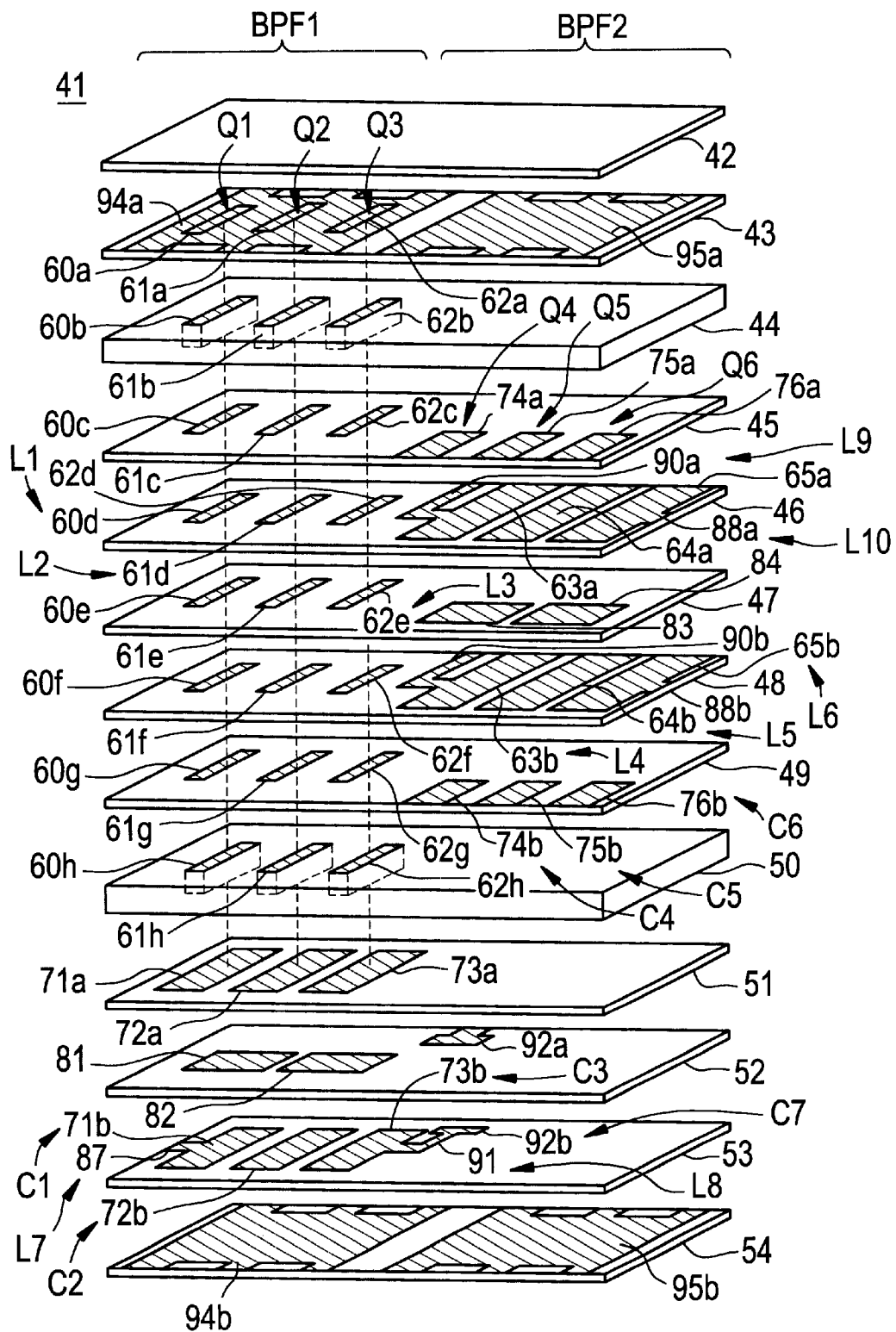
FIG. 1 is an exploded perspective view of a multi-layer composite electronic component according to a first preferred embodiment of the present invention.
Figure 2:
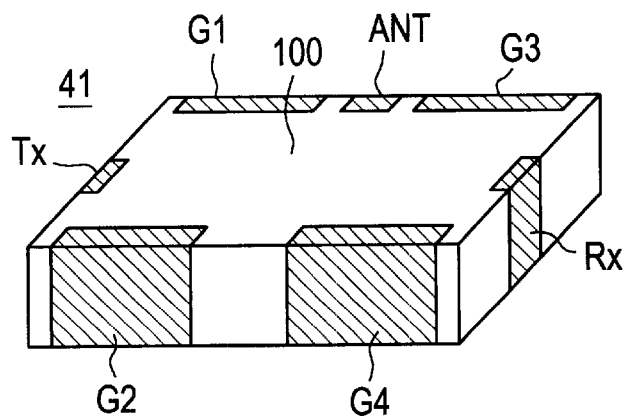
FIG. 2 is a perspective view showing the appearance of the multi-layer composite electronic component shown in FIG. 1.
Figure 3:
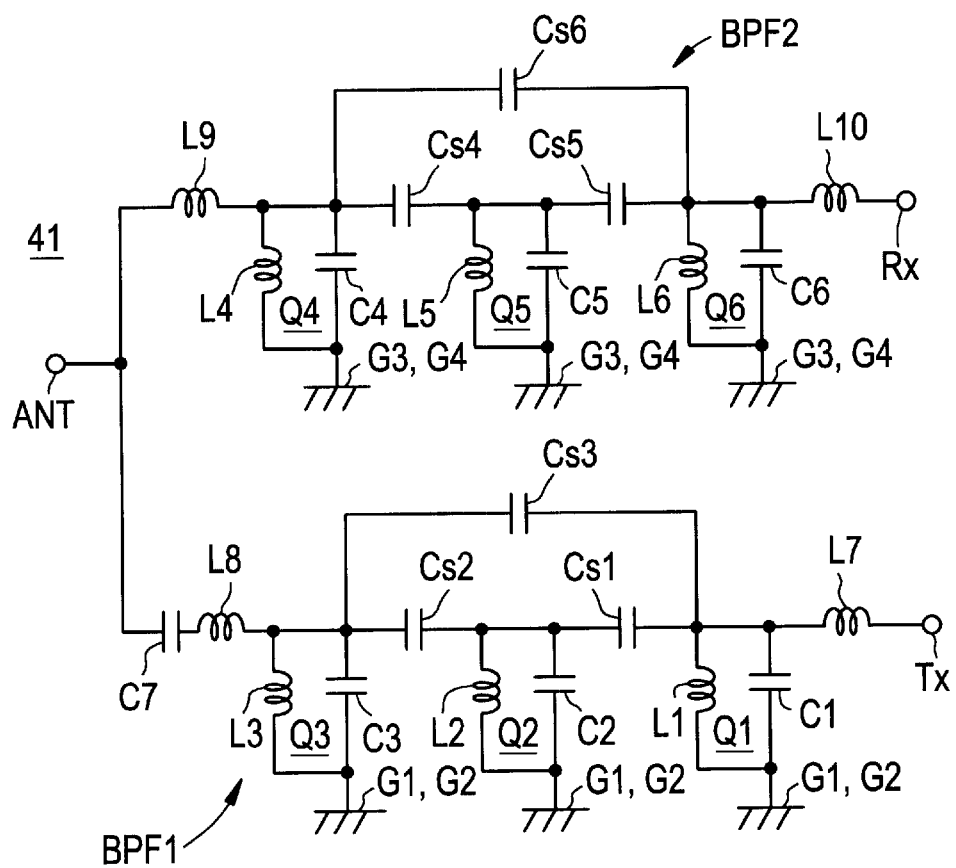
FIG. 3 is an electrically equivalent circuit diagram of the multi-layer composite electronic component shown in FIG. 2.

FIG. 1 shows the structure of a multi-layer duplexer 41; FIG. 2 shows a perspective view of the appearance of the duplexer 41; FIG. 3 shows an electrically equivalent circuit diagram thereof. As shown in FIG. 1, the duplexer 41 includes a combination of a three-stage band pass filter BPF 1 having LC parallel resonators Q1 to Q3 and a three-stage band pass filter BPF 2 having LC parallel resonators Q4 to Q6.

As shown in FIG. 1, the multi-layer duplexer 41 includes a dummy insulating sheet 44 having via-holes 60b to 62b provided thereon, a dummy insulating sheet 50 having via-holes 60h to 62h provided thereon, an insulating sheet 45 having via-holes 60c to 62c and capacitor patterns 74a to 76a provided thereon, an insulating sheet 49 having via-holes 60g to 62g and capacitor patterns 74b to 76b provided thereon, an insulating sheet 46 having via-holes 60d to 62d and inductor patterns 63a to 65a provided thereon, an insulating sheet 48 having via-holes 60f to 62f and inductor patterns 63b to 65b provided thereon, an insulating sheet 47 having via-holes 60e to 62e and coupling capacitor patterns 83 and 84 provided thereon, an insulating sheet 51 having capacitor patterns 71a to 73a provided thereon, an insulating sheet 53 having capacitor patterns 71b to 73b provided thereon, an insulating sheet 52 having coupling capacitors 81 and 82 provided thereon, an insulating sheet 43 having shield patterns 94a and 95a provided thereon, and an insulating sheet 54 having shield patterns 94b and 95b provided thereon.

The insulating sheets 42 to 54 are preferably made from the mixture of a dielectric powder, a magnetic powder, a binding agent and other suitable materials. The inductor patterns 63a to 65a, 63b to 65b capacitor patterns 71a to 76a, 71b to 76b, which are made of, for example, Ag, Pd, Cu, Au, or Ag—Pd, are formed by printing or other suitable processes. In addition, the via-holes 60a to 60h, 61a to 61h, 62a to 62h are formed by filling the conductive paste of a material such as Ag, Pd, Cu, Au, or Ag—Pd in holes provided beforehand in the insulating sheets 43 to 50.

The via-holes 60a to 60h extending through each of the insulating sheets, which are located in the substantially left-half region of the insulating sheets 43 to 50, are joined and connected in the thickness directions of the sheets 43 to 50 so as to define an inductor L1. One end of the inductor L1, which is the upper top-end face of the via-hole 60a, is directly connected to the shield pattern 94a. The other end thereof, which is the lower top-end face of the via-hole 60h, is directly connected to the capacitor pattern 71a. Similarly, the via-holes 61a to 61h, 62a to 62h are joined and connected in the thickness directions of the insulating sheets 43 to 50 so as to define inductors L2 and L3, respectively. One end of each of the inductors L2 and L3 is directly connected to the shield pattern 94a, and the other end thereof is directly connected to the capacitor patterns 72a and 73a, respectively.

The axes of the inductors L1 to L3 are substantially parallel to a stacking direction of the insulating sheets 43 to 50. As a result, when currents flow through the inductors L1 to L3, magnetic fields that are substantially perpendicular to the axial direction (stacking direction) of each of the inductors L1 to L3 are generated around each of the inductors.

The capacitor patterns 71a to 73a and 71b to 73b are located substantially in the left-half region of the insulating sheets 51 and 53. The capacitor pattern 71b is extended to be connected to a lead pattern 87, which is exposed to the left side of the sheet 53. The lead pattern 87 defines a coupling inductor L7, since the lead pattern 87 has its own inductance. The capacitor pattern 73b is connected to a capacitor pattern 92b via an inductor pattern 91. The inductor pattern 91 defines an impedance-matching inductor L8, since the inductor pattern 91 has its own inductance. The capacitor patterns 71a and 71b defines a capacitor C1, and the capacitor C1 and the inductor L1 constitute the LC parallel resonator Q1. The capacitor patterns 72a and 72b define a capacitor C2, and the capacitor C2 and the inductor L2 constitute the LC parallel resonator Q2. The capacitors 73a and 73b define a capacitor C3, and the capacitor C3 and the inductor L3 constitute the LC parallel resonator Q3.

The coupling capacitor patterns 81 and 82 are located between the capacitor patterns 71a to 73a and the 71b to 73b in the stacking direction of the sheets 42 to 54. The coupling capacitor patterns 81 and 82 are opposed to the capacitor patterns 71a to 73a and 71b to 73b while interposing the sheets 51 and 52 therebetween, respectively, to define a coupling capacitor Cs1 coupling the resonators Q1 and Q2, a coupling capacitor Cs2 coupling the resonators Q2 and Q3, and a coupling capacitor Cs3 coupling the resonators Q1 and Q3.

A capacitor pattern 92a is provided in the approximate center of the back of the insulating sheet 52. The capacitor pattern 92a is opposed to a capacitor pattern 92b via the sheet 52 disposed therebetween to define an impedance-matching capacitor C7. In addition, the wide area shield patterns 94a and 94b are disposed so as to interpose the via-holes 60a to 60h, 61a to 61h, 62a to 62h for the inductors L1, L2 and L3, the capacitor patterns 71a to 73a, 71b to 73b, therebetween.

The inductor patterns 63a to 65a and 63b to 65b are located substantially in the right-half region of the insulating sheets 46 and 48. The inductor patterns 63a and 63b having substantially the same configuration are laminated via the sheets 46 and 47 to define a dualstructure inductor L4. Similarly, the inductor patterns 64a and 64b define a dual-structure inductor L5, and the inductor patterns 65a and 65b define a dual-structure inductor L6. Since the inductors L4 to L6 have the dual structures, respectively, by adjusting the space between the inductor patterns 63a and 63b, the space between the inductor patterns 64a and 64b, and the space between the inductor patterns 65a and 65b, respectively, the distribution of a magnetic field H generated around each of the inductors L4 to L6 is optimized. As a result, concentrations of the magnetic fields H on the edges of the inductor patterns 63a to 65b are alleviated. One of each of the inductor patterns 63a to 65b is exposed at the back side of each of the sheets 46 and 48 in the substantially right-half region thereof.

The axes of the inductors L4 to L6 are substantially parallel to the surfaces of the insulating sheets 46 and 48. When currents flow through the inductors L4 to L6, respectively, magnetic fields that are substantially perpendicular to the axial directions of the inductors L4 to L6 is generated around each of the inductors L4 to L6.

The inductor pattern 63a is extended to be connected to a lead pattern 90a and the inductor pattern 63b is extended to be connected to a lead pattern 90b. The lead patterns 90a and 90b are exposed in the approximate centers of the back edges of the sheets 46 and 48, respectively. The lead patterns 90a and 90b define a coupling inductor L9, since the lead patterns 90a and 90b have their own inductance. The inductor pattern 65a is connected to a lead pattern 88a and the inductor pattern 65b is connected to a lead pattern 88b. The lead patterns 88a and 88b are exposed on the right edges of the sheets 46 and 48. The lead patterns 88a and 88b define a coupling inductor L10, since the lead patterns 88a and 88b have their own inductance.

The capacitor patterns 74a to 76a and 74b to 76b are located substantially in the right-half region of the insulating sheets 45 and 49. One end of each of the capacitor patterns 74a to 76a and 74b to 76b is exposed on the front edges of the sheets 45 and 49. The capacitor patterns 74a and 74b are opposed to the top-end portions of the inductor patterns 63a and 63b to interpose the sheets 45 and 48 therebetween to define a capacitor C4. The capacitor C4 and the dual-structure inductor L4 constitute the LC parallel resonator Q4. The capacitor patterns 75a and 75b are opposed to the top-end portions of the inductor patterns 64a and 64b to define a capacitor C5. The capacitor C5 and the dual-structure inductor L5 constitute the LC parallel resonator Q5. The capacitor patterns 76a and 76b are opposed to the top-end portions of the inductor patterns 65a and 65b to define a capacitor C6. The capacitor 6 and the dual-structure inductor L6 constitute the LC parallel resonator Q6.

The coupling capacitor patterns 83 and 84 are disposed close to the front side of the sheet 47, and are located between the inductor patterns 63a to 65a and 63b to 65b in the stacking direction of the sheets 42 to 54. The coupling capacitor patterns 83 and 84 are opposed to the top-end portions of the inductor patterns 63a to 65a and 63b to 65b, respectively, via the sheets 46 and 47 disposed therebetween to define a coupling capacitor Cs4 coupling the resonators Q4 and Q5, a coupling capacitor Cs5 coupling the resonators Q5 and Q6, and a coupling capacitor Cs6 coupling the resonators Q4 and Q6. In addition, the wide area shield patterns 95a and 96b are arranged via the patterns 63a to 65b and 74a to 76b disposed therebetween.

The sheets 42 to 54 having the above arrangements, as shown in FIG. 1, are sequentially laminated to be integrally fired to constitute a multi-layer body 100 shown in FIG. 2. A transmission terminal electrode Tx and a reception terminal electrode Rx are provided on the right and left end surfaces of the multi-layer body 100. An antenna terminal electrode ANT and ground terminal electrodes G1 and G3 are provided on the back side-surface of the multi-layer body 100, and ground terminal electrodes G2 and G4 are provided on the front side-surface thereof.

The transmission terminal electrode Tx is connected to the lead pattern 87 of the capacitor pattern 71b, and the reception terminal electrode Rx is connected to the lead patterns 88a and 88b of the inductor patterns 65a and 65b. The antenna terminal electrode ANT is connected to the lead patterns 90a and 90b of the inductor patterns 63a and 63b, and the capacitor pattern 92a. The ground terminal electrodes G1 and G2 are connected to the shield patterns 94a and 94b. The ground terminal electrode G3 is connected to one ends of the shield patterns 95a and 95b and ends of the inductor patterns 63a to 65a and 63b to 65b. The ground terminal electrode G4 is connected to the other ends of the shield patterns 95a and 95b and ends of the capacitor patterns 74a to 76a and 74b to 76b.

FIG. 3 is an electrically equivalent circuit diagram of the multi-layer duplexer 41 obtained by the above arrangements. The resonators Q1 to Q3 are electrically connected via the coupling capacitors Cs1 to Cs3 to define the three-stage band pass filter BPF 1. The resonators Q4 to Q6 are electrically connected via-the coupling capacitors Cs4 to Cs6 to define the three-stage band pass filter BPF 2. In addition, one end (the resonator Q1) of the band pass filter BPF 1 is connected to the transmission terminal electrode Tx via the coupling inductor L7, and the other end (the resonator Q3) thereof is connected to the antenna terminal electrode ANT via the impedance-matching capacitor C7 and the impedance-matching inductor L8. One end (the resonator Q6) of the band pass filter BPF 2 is connected to the reception terminal electrode Rx via the coupling inductor L10, and the other end thereof (the resonator Q4) is connected to the antenna terminal electrode ANT via the coupling inductor L9.

Next, a description will be given of the operational advantages of the multi-layer duplexer 41 described above. In the duplexer 41, signals input to the transmission terminal electrode Tx from a transmission circuit system (not shown) are output to the antenna terminal electrode ANT via the band pass filter circuit BPF 1, and signals input to the antenna terminal electrode ANT are transmitted to the reception terminal electrode Rx via the band pass filter circuit BPF 2 and outputted to a reception circuit system (not shown).

The pass frequency of the band pass filter circuit BPF 1 is determined by the resonant frequency of each of the resonator Q1 including the inductor L1 and the capacitor C1, the resonator Q2 including the inductor L2 and the capacitor C2, and the resonator Q3 including the inductor L3 and the capacitor C3. Furthermore, in order to adjust the pass frequency of the band pass filter circuit BPF 1, for example, the capacitance of each of the capacitors C1 to C3 is altered by changing the areas of the capacitor patterns 71a to 73a and 71b to 73b of the capacitors C1 to C3.

Meanwhile, the pass frequency of the band pass filter circuit BPF 2 is determined by the resonance frequency of each of the resonator Q4 including the inductor L4 and the capacitor C4, the resonator Q5 including the inductor L5 and the capacitor C5, and the resonator Q6 including the inductor L6 and the capacitor C6. In addition, the pass frequency of the band pass filter BPF 2 is adjusted, for example, by changing the opposing areas of the capacitor patterns 74a to 76a and 74b to 76b of the capacitors C4 to C6.

In this multi-layer duplexer 41, as shown in FIG. 1, the axial directions of the inductors L1 to L3 of the band pass filter circuit BPF 1 are substantially perpendicular to the axial directions of the inductors L4 to L6 of the band pass filter circuit BPF 2. Thus, a magnetic field generated when currents flow through each of the inductors L1 to L3 is substantially perpendicular-to a magnetic field generated when currents flow through each of the inductors L4 to L6, with the result that electric couplings between the inductors L1 to L3 and the inductors L4 to L6 are minimized. Therefore, the multi-layer duplexer 41 of preferred embodiments of the present invention has much less deterioration in its attenuation characteristics and much less impedance deviation.

It is not necessary that the inductor L8 provided for impedance matching and electrically connected between the band pass filter circuits BPFs 1 and 2, or the inductors L7, L9, and L10 for coupling the band pass filter circuits BPFs 1 and 2 with the electrodes Tx, Rx, and the antenna ANT are disposed substantially perpendicularly to each other.

Figure 4:
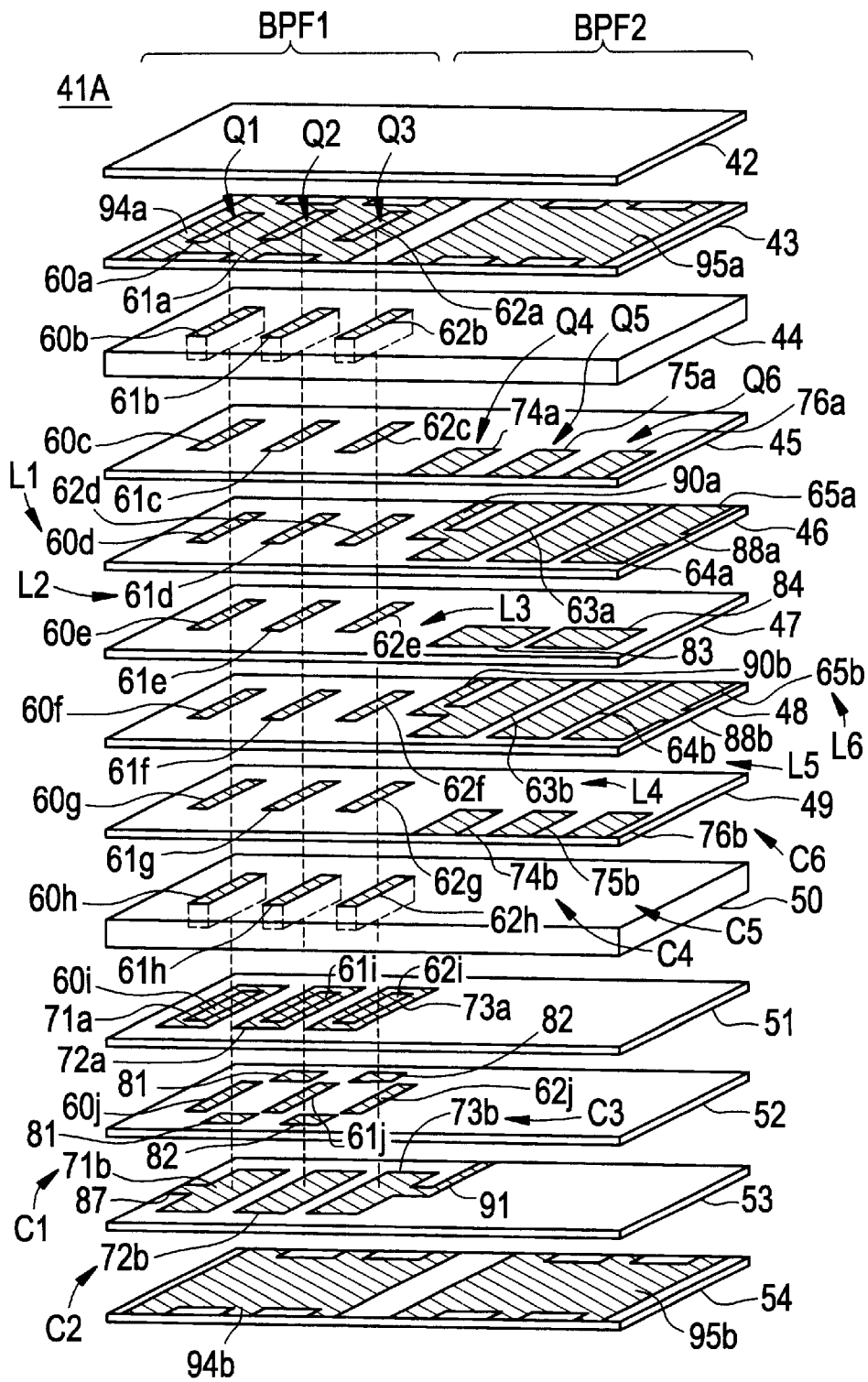
FIG. 4 is an exploded perspective view of a multi-layer composite electronic component according to a second preferred embodiment of the present invention.
Figure 5:
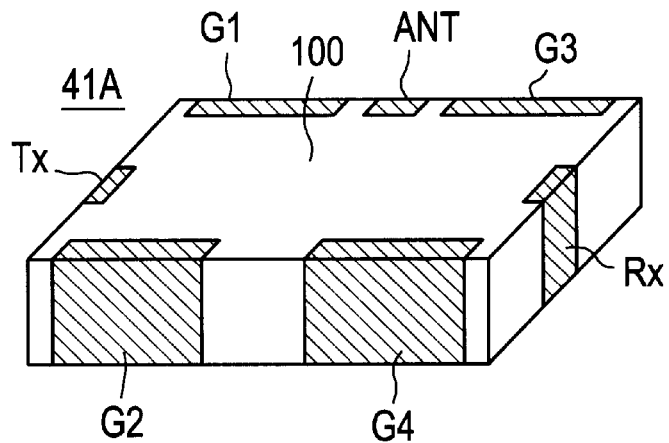
FIG. 5 is a perspective view showing the appearance of the multi-layer composite electronic component shown in FIG. 4.
Figure 6:
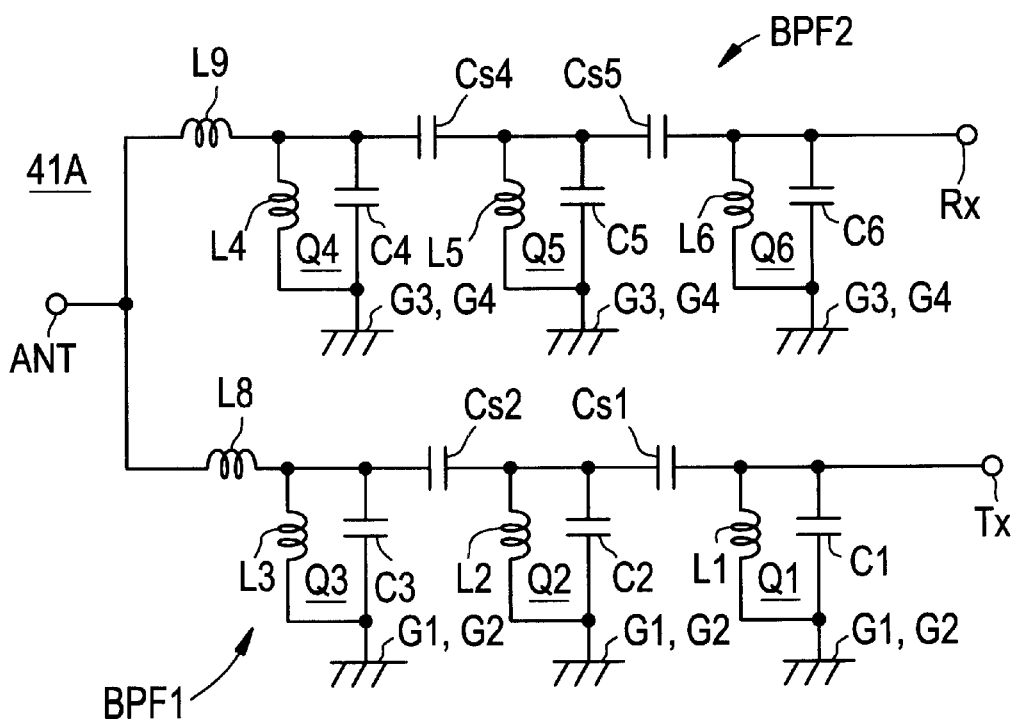
FIG. 6 is an electrically equivalent circuit diagram of the multi-layer composite electronic component shown in FIG. 5.

FIG. 4 shows the structure of a multi-layer duplexer 41A; FIG. 5 shows a perspective view of the appearance of the multi-layer duplexer 41A; FIG. 6 shows an electrically equivalent circuit diagram thereof. As shown in FIG. 4, the multi-layer duplexer 41A includes the combination of a three-stage band pass filter BPF 1 having LC parallel resonators Q1 to Q3 and a three-stage band pass filter BPF 2 having LC parallel resonators Q4 to Q6.

In FIG. 4, the multi-layer duplexer 41A includes a dummy insulating sheet 44 having via-holes 60b to 62b provided thereon, a dummy insulating sheet 50 having viaholes 60h to 62h provided thereon, an insulating sheet 45 having via-holes 60c to 62c and capacitor patterns 74a to 76a, an insulating sheet 49 having via-holes 60g to 62g and capacitor patterns 74b and 76b, an insulating sheet 46 having via-holes 60d to 62d and inductor patterns 63a to 65a provided thereon, an insulating sheet 48 having via-holes 60f to 62f and inductor patterns 63b to 65b provided thereon, an insulating sheet 47 having via-holes 60e to 62e and coupling capacitor patterns 83 and 84 provided thereon, an insulating sheet 51 having capacitor patterns 71a to 73a and via-holes 60i to 62i provided thereon, an insulating sheet 53 having capacitor patterns 71b to 73b provided thereon, an insulating sheet 52 having coupling capacitor patterns 81 and 82 and via-holes 60j to 62j, an insulating sheet 43 having shield patterns 94a and 95a provided thereon, an insulating sheet 54 having 94b and 95b provided thereon, and the like.

The insulating sheets 42 to 54 are preferably made of the mixture of a dielectric powder, a magnetic powder, a binding agent, or other suitable material. The inductor patterns 63a to 65a and 63b to 65b, the capacitor patterns 71a to 76a, 71b to 76b, which are preferably made of a material such as Ag, Pd, Cu, Au, Ag—Pd, are formed by printing or other suitable process. In addition, the via-holes 60a to 60j, 61a to 61j, and 62a to 62j are formed by filling a conductive paste of Ag, Pd, Cu, Au, Ag—Pd, or other suitable process, in holes provided in advance in the insulating sheets 43 to 50.

The via-holes 60a to 60j, which are located substantially in the left-half regions of the insulating sheets 43 to 52, are arranged in the thickness directions of the sheets 43 to 52 to be joined to define an inductor L1. One end of the inductor L1, which is the upper top-end surface of the via-hole 60a, is directly connected to the shield pattern 94a, and the other end thereof, which is the lower top-end surface of each of the via-holes 60h and 60j, is directly connected to the capacitor patterns 71a and 71b, respectively. Similarly, the via-holes 61a to 61j and 62a to 62j are arranged in the thickness directions of the insulating sheets 43 to 52 to be joined to define inductors L2 and L3. One end of each of the inductors L2 and L3 is directly connected to the shield pattern 94a, and the other end thereof is directly connected to the capacitor patterns 72a, 72b, 73a, and 73b, respectively.

The axes of the inductors L1 to L3 are substantially parallel to a direction in which the insulating sheets 43 to 50 are laminated. As a result, when currents flow through each of, the inductors L1 to L3, a magnetic field that is substantially perpendicular to the axial direction of each of the inductors L1 to L3 is generated around each thereof.

The capacitor patterns 71a to 73a and 71b to 73b are located substantially in the left-half regions of the insulating sheets 51 and 53. The capacitor pattern 71b is connected to a lead pattern 87, which is exposed to the left side of the sheet 53. The capacitor pattern 73b is exposed in the approximate center of the back of the sheet 53 via the inductor pattern 91. The inductor pattern 91 defines an impedance-matching inductor L8 due to the inductance of the inductor pattern 91. The capacitor pattern 71b and the shield pattern 94b define a capacitor C1, and the capacitor C1 and the inductor L1 constitute the LC parallel resonator Q1. The capacitor pattern 72b and the shield pattern 94b define a capacitor C2, and the capacitor C2 and the inductor L2 constitute the LC parallel resonator Q2. The capacitor 73b and the shield pattern 94b define a capacitor C3, and the capacitor C3 and the inductor L3 constitute the LC parallel resonator Q3.

The coupling capacitor patterns 81 and 82 are located between the capacitor patterns 71a to 73a and the 71b to 73b in the direction in which the sheets 42 to 54 are laminated. The coupling capacitor patterns 81 and 82 are opposed to the capacitor patterns 71a to 73a and 71b to 73b, respectively, while having the sheets 51 and 52 therebetween to define a coupling capacitor Cs1 coupling the resonators Q1 and Q2, and a coupling capacitor Cs2 coupling the resonators Q2 and Q3.

The wide shield patterns 94a and 94b are arranged such that the via-holes 60a to 60j, 61a to 61j, and 62a to 62j, the patterns 71a to 73a and 71b to 73b, are disposed therebetween.

The inductor patterns 63a to 65a and 63b to 65b are located substantially in the right-half regions of the insulating sheets 46 and 48. The inductor patterns 63a and 63b having substantially the same configuration are laminated via the sheets 46 and 47 to define a dual-structure inductor L4. Similarly, the inductor patterns 64a and 64b define a dual-structure inductor L5, and the inductor patterns 65a and 65b define a dual-structure inductor L6. Since the inductors L4 to L6 have the dual structures, respectively, by adjusting the space between the inductor patterns 63a and 63b, the space between the inductor patterns 64a and 64b, and the space between the inductor patterns 65a and 65b, respectively, the distribution of a magnetic field H generated around each of the inductors L4 to L6 is optimized. As a result, concentrations of the magnetic fields H on the edges of the inductor patterns 63a to 65b can be alleviated. One end of each of the inductor patterns 63a to 65b is exposed substantially in the right-half region of the back of each of the sheets 46 and 48.

The axes of the inductors L4 to L6 are substantially parallel to the surfaces of the insulating sheets 46 and 48. When currents flow through each of the inductors L4 to L6, magnetic fields are substantially perpendicular to the axial directions of the inductors L4 to L6 are generated around the inductors L4 to L6.

The inductor pattern 63a is connected to a lead pattern 90a, and the inductor pattern 63b is connected to a lead pattern 90b. The lead patterns 90a and 90b are exposed in the approximate centers of the back edges of the sheets 46 and 48, respectively. The lead patterns 90a and 90b define a coupling inductor L9 due to the inductances of both the lead patterns 90a and 90b. The inductor pattern 65a is connected to a lead pattern 88a, and the inductor pattern 65b is connected to a lead pattern 88b. The lead pattern 88a is exposed on the right edge of the sheet 46, and the lead pattern 88b is exposed on the right edge of the sheet 48.

The capacitor patterns 74a to 76a and 74b to 76b are located substantially in the right-half regions of the insulating sheets 45 and 49. One end of each of the capacitor patterns 74a to 76a and 74b to 76b is exposed on the front edges of the sheets 45 and 49. The capacitor patterns 74a and 74b are opposed to the top-end portions of the inductor patterns 63a and 63b while having the sheets 45 and 48 located therebetween to define a capacitor C4. The capacitor C4 and the dual-structure inductor L4 constitute the LC parallel resonator Q4. The capacitor patterns 75a and 75b are opposed to the top-end portions of the inductor patterns 64a and 64b to define a capacitor C5. The capacitor C5 and the dual-structure inductor L5 constitute the LC parallel resonator Q5. The capacitor patterns 76a and 76b are opposed to the top-end portions of the inductor patterns 65a and 65b to define a capacitor C6. The capacitor 6 and the dual-structure inductor L6 constitute the LC parallel resonator Q6.

The coupling capacitor patterns 83 and 84 are disposed close to the front side of the sheet 47, and are located between the inductor patterns 63a to 65a and 63b to 65b in the direction in which the sheets 42 to 54 are laminated. The coupling capacitor patterns 83 and 84 are opposed to the top-end portions of the inductor patterns 63a to 65a and 63b to 65b, respectively, via the sheets 46 and 47 located therebetween to define a coupling capacitor Cs4 coupling the resonators Q4 and Q5 and a coupling capacitor Cs5 coupling the resonators QS and Q6. In addition, the wide shield patterns 95a and 95b are disposed such that the patterns 63a to 65b and 74a to 76b are located therebetween.

The sheets 42 to 54 having the above arrangements, as shown in FIG. 4, are sequentially laminated to be integrally fired so as to constitute a multi-layer body 100 shown in FIG. 5. A transmission terminal electrode Tx and a reception terminal electrode Rx are provided on the right and left end faces of the multi-layer body 100. An antenna terminal electrode ANT and ground terminal electrodes G1 and G3 are provided on the back side-surface of the multi-layer body 100, and ground terminal electrodes G2 and G4 are provided on the front side-surface thereof.

The transmission terminal electrode Tx is connected to the lead pattern 87 of the capacitor pattern 71b, and the reception terminal electrode Rx is connected to the lead patterns 88a and 88b of the inductor patterns 65a and 65b. The antenna terminal electrode.ANT is connected to the lead patterns 90a and 90b of the inductor patterns 63a and 63b, and the inductor pattern 91. The ground terminal electrodes G1 and G2 are connected to the shield patterns 94a and 94b. The ground terminal electrode G3 is connected to ends of the shield patterns 95a and 95b and the inductor patterns 63a to 65a and 63b to 65b. The ground terminal electrode G4 is connected to ends of the shield patterns 95a and 95b and the capacitor patterns 74a to 76a and 74b to 76b.

FIG. 6 is an electrically equivalent circuit diagram of the multi-layer duplexer 41A defined by the above arrangements. The resonators Q1 to Q3 are electrically connected via the coupling capacitors Cs1 and Cs2 to define the three-stage band pass filter BPF 1. The resonators Q4 to Q6 are electrically connected via the coupling capacitors Cs4 and Cs5 to define the three-stage band pass filter BPF 2. In addition, one end (the resonator Q1) of the band pass filter BPF 1 is connected to the transmission terminal electrode Tx, and the other end (the resonator Q3) thereof is connected to the antenna terminal electrode ANT via the impedance-matching inductor L8. One end (the resonator Q6) of the band pass filter BPF 2 is connected to the reception terminal electrode Rx, and the other end thereof (the resonator Q4) is connected to the antenna terminal electrode ANT via the coupling inductor L9.

Next, a description will be given of the operational advantages of the multi-layer duplexer 41A described above. In the duplexer 41A, signals input to the transmission terminal electrode Tx from a transmission circuit system (not shown) are output to the antenna terminal electrode ANT via the band pass filter circuit BPF 1. Signals input to the antenna terminal electrode ANT are transmitted to the reception terminal electrode Rx via the band pass filter circuit BPF 2 and output to a reception circuit system (not shown).

The pass frequency of the band pass filter circuit BPF 1 is determined by the resonant frequency of each of the resonator Q1 constituted of the inductor L1 and the capacitor C1, the resonator Q2 constituted of the inductor L2 and the capacitor C2, and the resonator Q3 constituted of the inductor L3 and the capacitor C3. Furthermore, in order to adjust the pass frequency of the band pass filter circuit BPF 1, for example, the capacitance of each of the capacitors C1 to C3 is altered by changing the areas of the capacitor patterns 71a to 73a and 71b to 73b of the capacitors C1 to C3.

Meanwhile, the pass frequency of the band pass filter circuit BPF 2 is determined by the resonance frequency of each of the resonator Q4 constituted of the inductor L4 and the capacitor C4, the resonator Q5 constituted of the inductor L5 and the capacitor C5, and the resonator Q6 constituted of the inductor L6 and the capacitor C6. In addition, the pass frequency of the band pass filter BPF 2 is adjusted, for example, by changing the opposing areas of the capacitor patterns 74a to 76a and 74b to 76b of the capacitors C4 to C6.

In the multi-layer duplexer 41A, as shown in FIG. 4, the axial directions of the inductors L1 to L3 of the band pass filter circuit BPF 1 are disposed substantially perpendicularly to the axial directions of the inductors L4 to L6 of the band pass filter circuit BPF 2. As a result, a magnetic field generated when currents flow through each of the inductors L1 to L3 is substantially perpendicular to a magnetic field generated when currents flow through each of the inductors L4 to L6. Thus, electric couplings between the inductors L1 to L3 and the inductors L4 to L6 are minimized. Therefore, in the multi-layer duplexer 41A of a preferred embodiment of the present invention, attenuation-characteristic deterioration and impedance mismatching are greatly reduced.

It is not necessary that the inductors L8 and L9 provided for impedance matching and electrically connected between the band pass filter circuits BPFs 1 and 2, are arranged substantially perpendicularly.

Figure 7:
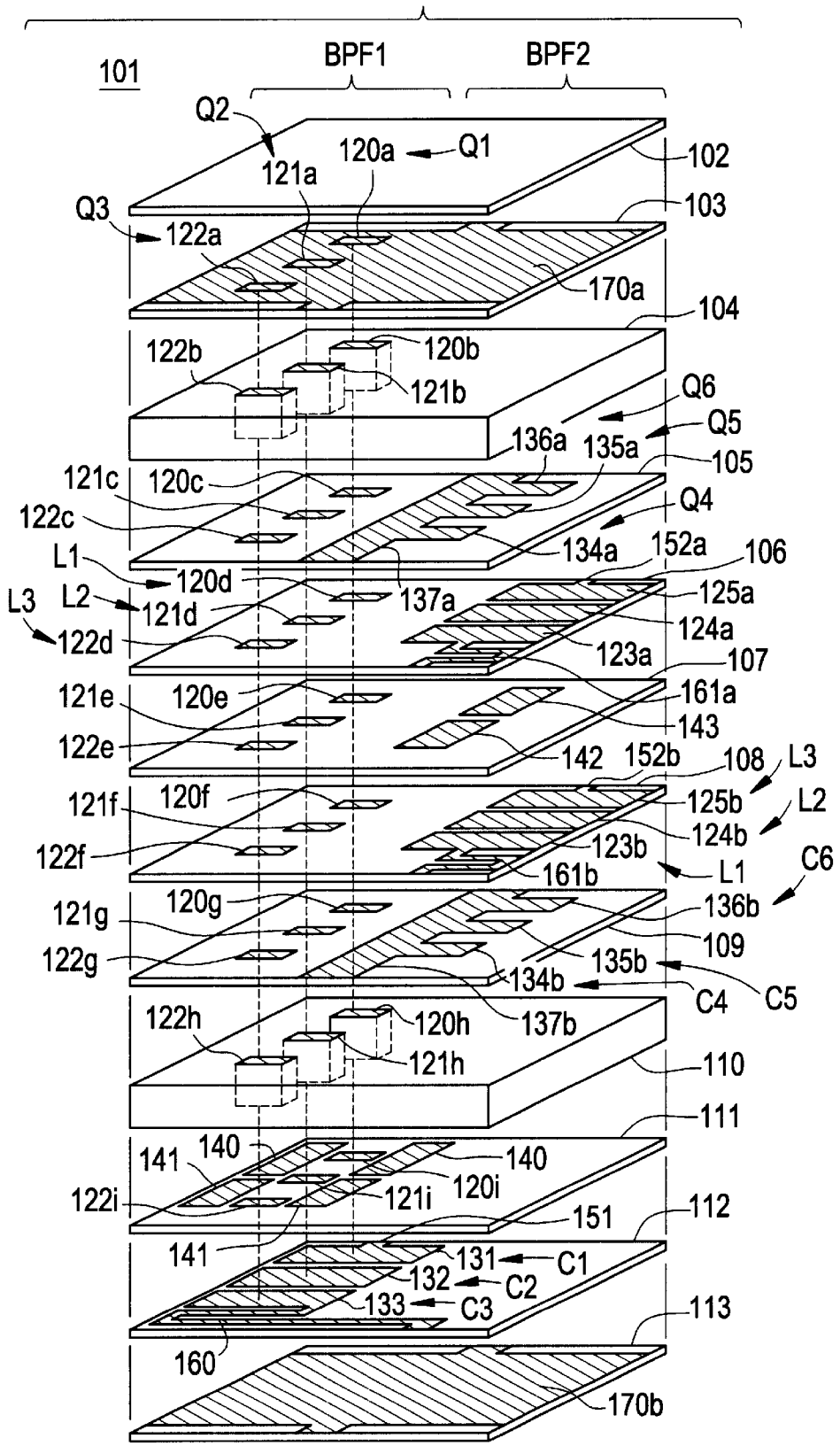
FIG. 7 is an exploded perspective view of a multi-layer composite electronic component according to a third preferred embodiment of the present invention.
Figure 8:
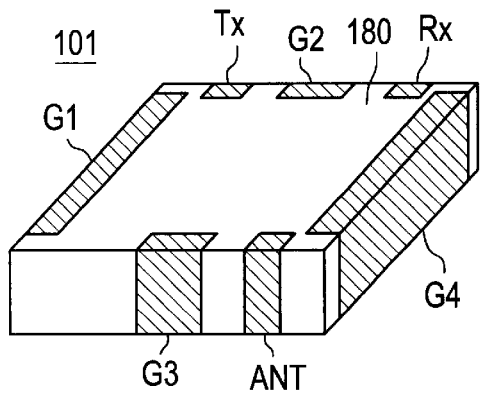
FIG. 8 is a perspective view showing the appearance of the multi-layer composite electronic component shown in FIG. 7.
Figure 10:
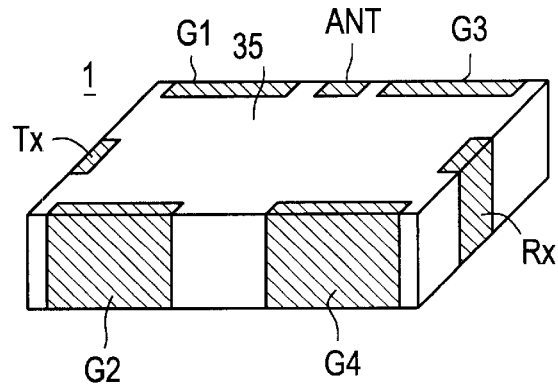
FIG. 10 is a perspective view showing the appearance of the conventional multi-layer composite electronic component shown in FIG. 9.
Figure 9:
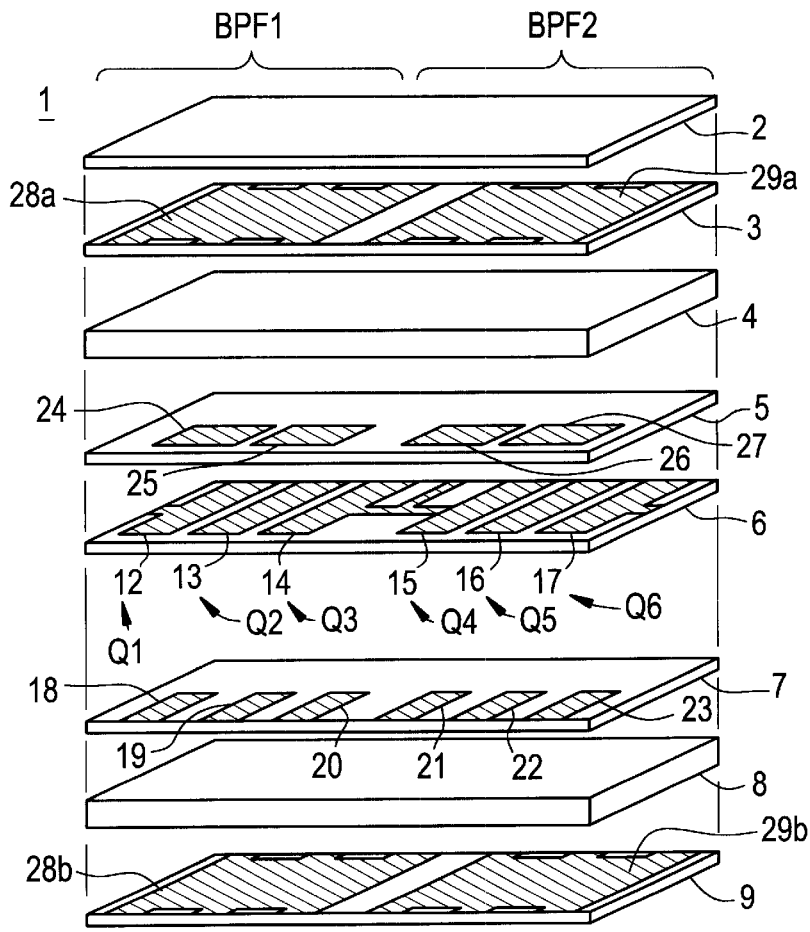
FIG. 9 is an exploded perspective view of a conventional multi-layer composite electronic component.

FIG. 7 shows the structure of a multi-layer duplexer 101, and FIG. 8 shows a perspective view of the appearance showing the duplexer 101. As shown in FIG. 7, the duplexer 101 includes a combination of a three-stage band pass filter BPF 1 having LC parallel resonators Q1 to Q3 and a three-stage band pass filter BPF 2 having LC parallel resonators Q4 to Q6.

As shown in FIG. 7, the multi-layer duplexer 101 is constituted of insulating sheets 102 to 113 including via-holes including 120a to 120i, 121a to 121i, and 122a to 122i, inductor patterns including 123a, 123b, 124a, 124b, 125a, and 125b, the capacitor patterns 131 to 133, 134a, 134b, 135a, 135b, 136a, and 136b, coupling capacitor patterns 140 to 143, shield patterns 170a and 170b and the like.

The via-holes 120a to 120i, which are located substantially in the left-half regions of the insulating sheets 103 to 111, are formed in the thickness directions of the sheets 103 to 111 to be joined to define an inductor L1. One end of the inductor L1, which is the upper top-end surface of the via-hole 120a, is directly connected to the shield pattern 170a, and the other end thereof, which is the lower top-end surface of the via-hole 120i, is directly connected to the capacitor pattern 131. Similarly, the via-holes 121a to 121i and 122a to 122i are formed in the thickness directions of the insulating sheets 103 to 111 to be joined to define inductors L2 and L3. One end of each of the inductors L2 and L3 is directly connected to the shield pattern 170a, and the other end thereof is directly connected to the capacitor patterns 132 and 133.

These inductors L1 to L3 are arranged in order from the back edges of the insulating sheets 103 to 111 toward the front edges thereof. In this situation, when the lengths of pillar inductors L1 to L3 constituted by the via-holes 120a to 120i, 121a to 121i, and 122a to 122i are preferably about $\lambda/4$, in which x indicates the wavelength of a desired resonant frequency, the LC resonators Q1 to Q3 are $\lambda/4$ resonators. Naturally, the lengths of the inductors L1 to L3 are not limited to $\lambda/4$.

The axes of the inductors L1 to L3 are substantially parallel to a direction in which the insulating sheets 103 to 111 are laminated. As a result, when currents flow through each of the inductors L1 to L3, a magnetic field that is substantially perpendicular to the axial direction of each of the inductors L1 to L3 is generated around each of the inductors L1 to L3.

The capacitor patterns 131 to 133 are located substantially in the left-half region of the insulating sheets 112 in such a manner that the patterns 131 to 133 are arranged in order from the back edge of the insulating sheet 112 toward the front edge thereof. The capacitor pattern 131 is connected to a lead pattern 151, which is exposed on the left side of the back edge of the sheet 112. The capacitor pattern 133 is connected to the inductor pattern 160. The inductor pattern 160 defines an impedance-matching inductor L8 due to the inductance of the inductor pattern 160. The end of the inductor pattern 160 is exposed on the right side of the front edge of the sheet 112. The capacitor pattern 131 is opposed to the shield pattern 170b via the sheet 112 located therebetween to define a capacitor C1, and the capacitor C1 and the inductor L1 constitute the LC parallel resonator Q1. The capacitor pattern 132 is opposed to the shield pattern 170b via the sheet 112 located therebetween to define a capacitor C2. The capacitor C2 and the inductor L2 constitute the LC parallel resonator Q2. The capacitor pattern 133 is opposed to the shield pattern 170b via the sheet 112 located therebetween to define a capacitor C3. The capacitor C3 and the inductor L3 constitute the LC parallel resonator Q3.

The coupling capacitor patterns 140 and 141 are opposed to the capacitor patterns 131 to 133 via the sheet 111 located therebetween to define a coupling capacitor Cs1 coupling the resonators Q1 and Q2 and a coupling capacitor Cs2 coupling the resonators Q2 and Q3.

The inductor patterns 123a to 125a and 123b to 125b are provided substantially in the right-half regions of the insulating sheets 106 and 108. The inductor patterns 123a to 125a and 123b to 125b extend substantially parallel to each other from the right edge toward the left side of the insulating sheets 106 and 108, respectively. One end of each of the inductor patterns 123a to 125a and one end of the inductor patterns 123b to 125b are exposed on the right edges of each of the insulating sheets 106 and 108, and the other ends thereof are open.

The inductor patterns 123a and 123b having substantially the same configuration are laminated via the sheets 106 and 107 to define a dual-structure inductor L4. Similarly, the inductor patterns 124a and 124b define a dual-structure inductor L5, and the inductor patterns 125a and 125b define a dual-structure inductor L6. Since the inductors L4 to L6 have the dual structures, respectively, by adjusting the space between the inductor patterns 123a and 123b, the space between the inductor patterns 124a and 124b, and the space between the inductor patterns 125a and 125b, respectively, the distribution of a magnetic field H generated around each of the inductors L4 to L6 is optimized. As a result, concentrations of the magnetic fields H on the edges of the inductor patterns 123a to 125b are alleviated. In addition, when the lengths of the inductor patterns 123a to 125b are preferably about $\lambda/4$, the LC resonators Q4 to Q6 are $\lambda/4$ resonators. The lengths of the inductor patterns 123a to 125b are not limited to $\lambda/4$.

The axes of the inductors L4 to L6 are substantially parallel to the surfaces of the insulating sheets 106 to 108. As a result, when currents flow through each of the inductors L4 to L6, a magnetic field that is substantially perpendicular to the axial direction of each of the inductors L4 to L6 is generated around each of the inductors L4 to L6.

The inductor pattern 123a is connected to an inductor pattern 161a, and the inductor pattern 123b is connected to an inductor pattern 161b. The inductor pattern 161a is exposed on the right side of the front edge of the sheet 106, and the inductor pattern 161b is exposed on the right side of the front edge of the sheet 108. The inductor patterns 161a and 161b define a coupling inductor L9 due to the inductances of both the inductor patterns 161a and 161b. The inductance pattern 125a is connected to a lead pattern 152a, and the inductance pattern 125b is connected to a lead pattern 152b. The lead pattern 152a is exposed on the right side of the back edge of the sheet 106, and the lead pattern 152b is exposed on the right side of the back edge of the sheet 108.

The capacitor patterns 134a to 136a and 134b to 136b are provided in the regions close to the right of the approximate center of each of the insulating sheets 105 and 109. One end of each of the capacitor patterns 134a to 136a is electrically connected to a connecting pattern 137a, and one end of each of the capacitor patterns 134b to 136b is electrically connected to a connecting pattern 137b. Both ends of each of the connecting patterns 137a and 137b are exposed on the back edges and front edges of the sheets 105 and 109, respectively. The capacitor patterns 134a and 134b are opposed to the top-end portions of the inductor patterns 123a and 123b via the sheets 105 and 108 disposed therebetween, respectively, to define a capacitor C4. The capacitor C4 and the dual-structure inductor L4 constitute the LC parallel resonator Q4. The capacitor patterns 135a and 135b are opposed to the top-end portions of the inductor patterns 124a and 124b, respectively to define a capacitor C5. The capacitor C5 and the dual-structure inductor L5 constitute the LC parallel resonator Q5. The capacitor patterns 136a and 136b are opposed to the top-end portions of the inductor patterns 125a and 125b, respectively to define a capacitor C6. The capacitor C6 and the dual-structure inductor L6 constitute the LC parallel resonator Q6.

Coupling capacitor patterns 142 and 143 are located between the inductor patterns 123a to 125a and 123b to 125b in a direction in which the sheets 102 to 113 are laminated. The coupling capacitor patterns 142 and 143 are opposed to the top-end portions of the inductor patterns 123a to 125a and 123b to 125b via the sheets 106 and 107 disposed therebetween to define a coupling capacitor Cs4 coupling the resonators Q4 and Q5 and a coupling capacitor Cs5 coupling the resonators Q5 and Q6. In addition, the wide shield patterns 170a and 170b are disposed in such a manner that the via-holes 120a to 120i, 121a to 121i, and 122a to 122i, and the patterns 131 to 133, 123a to 125b, and 134a to 136b are located therebetween.

The sheets 102 to 113 having the above arrangements, as shown in FIG. 7, are sequentially laminated to be integrally sintered to constitute a multi-layer body 180 shown in FIG. 8. Ground terminal electrodes G1 and G4 are provided on the right and left end surfaces of the multi-layer body 180. An antenna terminal electrode ANT and a ground terminal electrode G3 are provided on the front side-surface of the multi-layer body 180. Furthermore, a transmission terminal electrode Tx, a reception terminal electrode Rx, and a ground terminal electrode G2 are located on the back side-surface thereof.

The transmission terminal electrode Tx is connected to the lead pattern 151 of the capacitor pattern 131, and the reception terminal electrode Rx is connected to the lead patterns 152a and 152b of the inductor patterns 125a and 125b. The antenna terminal electrode ANT is connected to the inductor patterns 160, 161a, and 161b. The ground terminal electrode G1 is connected to the shield patterns 170a and 170b, and the ground terminal electrodes G2 and G3 are connected to the shield patterns 170a and 170b and the connecting patterns 137a and 137b. The ground electrode G4 is connected to the ends of the shield patterns 170a and 170b and the inductor patterns 123a to 125a and 123b to 125b.

The multi-layer duplexer 101 having the above-described arrangements preferably has substantially the same electrically equivalent circuit as that shown in FIG. 6. The resonators Q1 to Q3 are electrically connected to each other via the coupling capacitors Cs1 and Cs2 to define a three-stage band pass filter BPF 1. The resonators Q4 to Q6 are electrically connected to each other via the coupling capacitors Cs4 and Cs5 to define a three-stage band pass filter BPF 2. In addition, one end (the resonator Q1) of the band pass filter BPF 1 is connected to the transmission terminal electrode Tx, and the other end (the resonator Q3) thereof is connected to the antenna terminal electrode ANT via the impedance-matching inductor L8. One end (the resonator Q6) of the band pass filter BPF 2 is connected to the reception terminal electrode Rx, and the other end (the resonator Q4) is connected to the antenna terminal electrode ANT via the coupling inductor L9.

As shown in FIG. 7, in the multi-duplexer 101, the inductors L1 to L6 are arranged in a line, and the axial directions of the inductors L1 to L3 of the band pass filter circuit BPF 1 are preferably substantially perpendicular to the axial directions of the inductors L4 to L6 of the band pass filter circuit BPF 2. Therefore, a magnetic field generated when currents flow through each of the inductors L1 to L3 is preferably substantially perpendicular to a magnetic field generated when currents flow through each of the inductors L4 to L6, with the result that electric couplings between the inductors L1 to L3 and the inductors L4 to L6 are minimized. Therefore, in the multi-layer duplexer 101 of preferred embodiments of the present invention, attenuation-characteristic deterioration, impedance deviation and the like are greatly reduced.

The multi-layer composite electronic component according to the present invention is not limited to the above preferred embodiments, and various modifications and changes can be applied within the scope and spirit of the invention as defined by the appended claims. For example, although the preferred embodiments have described the examples of the duplexers constructed by the combination of the band pass filter circuits, other combinations can be applied. For example, a low pass filter circuit, a high pass filter circuit, a trap circuit may be combined, or the different kinds of circuits may be combined to constitute the duplexer of various preferred embodiments of the present invention. Furthermore, as an alternative to the duplexer, the composite electronic component of preferred embodiments of the present invention may be a triplexer, a diplexer, or a filter array, in which a plurality of filters are contained in a single multi-layer body. For example, a diplexer used in the present invention may be constructed by the combination of a low pass filter circuit and a high pass filter circuit. A filter array according to a preferred embodiment of the present invention may have a plurality of band pass filters having independent functions therein.

In addition, in the above-described preferred embodiments, although all of the inductors L1 to L3 of the band pass filter circuit BPF 1 are disposed substantially perpendicularly to all of the inductors L4 to L6, it is not always necessary to dispose all of the inductors in that manner, for example, when no electric couplings occur between inductors since there are spaces between the inductors, when the electric characteristics are not affected even if electric couplings occur between the inductors, or when electric couplings occurring between the inductors are positively used.

In addition, in the first and second preferred embodiments, the axial directions of the inductors L1 to L3 of the band pass filter BPF 1 are disposed substantially parallel to the stacking direction of the sheets 42 to 54. Further, it is also possible to dispose the axial directions of the inductors L4 to L6 of the band pass filter BPF 2 substantially parallel to the stacking direction of the sheets 42 to 54, while the axial directions of the inductors L1 to L3 of the band pass filter BPF 1 are disposed substantially parallel to the surfaces of the sheets 42 to 54.

Furthermore, in the above-described preferred embodiments, the insulating sheets having the conductors disposed thereon are laminated to be integrally fired. However, this is not the only case applicable to the present invention. It is also possible to laminate insulating sheets fired in advance.

Alternatively, there may be provided a composite electronic component formed by the following method. After an insulating layer made of a paste insulating material is formed by printing or other suitable process, a paste conductive material is applied on the surface of the insulating layer to define an arbitrary conductor. Next, the paste insulating material is again applied on the conductor to define an insulating layer containing the conductor therein. Similarly, by sequentially applying the paste conductive material and the paste insulating material, a composite electronic component having a multi-layer body is obtained.

As described above, in the present invention, since at least one of the inductors of the first high-frequency circuit is disposed substantially perpendicularly to at least one of the inductors of the second high-frequency circuit, the magnetic-field components generated around the inductors are substantially perpendicular to each other, the electric couplings occurring between the inductors are thereby minimized. As a result, it is not necessary to take measures such as increasing of the space between the first high-frequency circuit and the second high-frequency circuit. Furthermore, it is also possible to set the space between the first high-frequency circuit and the second high-frequency circuit to be narrower than that in the conventional art. Accordingly, the multi-layer composite electronic component of the present invention is miniaturized.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A multi-layer composite electronic component comprising:

a multi-layer body defined by a plurality of insulating layers, a plurality of inductor conductors, and a plurality of capacitor conductors;

a first high-frequency circuit having a plurality of LC resonators including a plurality of inductors defined by the inductor conductors and a plurality of capacitors defined by the capacitor conductors; and a second high-frequency circuit having a plurality of LC resonators including a plurality of inductors defined by the inductor conductors and a plurality of capacitors defined by the capacitor conductors;

wherein at least one of the inductors of the first high-frequency circuit is disposed substantially perpendicularly to at least one of the inductors of the second high-frequency circuit.

2. The multi-layer composite electronic component according to claim 1, further comprising a first three-stage band pass filter and a second three-stage band pass filter.

3. The multi-layer composite electronic component according to claim 1, wherein the first three-stage band pass filter includes at least three LC parallel resonators.

4. The multi-layer composite electronic component according to claim 1, wherein the second three-stage band pass filter includes at least three LC parallel resonators.

5. The multi-layer composite electronic component according to claim 1, further comprising a first dummy insulating sheet having first via-holes provided thereon, a second dummy insulating sheet having second via-holes provided thereon, a first insulating sheet having third via-holes and first capacitor patterns provided thereon, a second insulating sheet having fourth via-holes and second capacitor patterns provided thereon, a third insulating sheet having fifth via-holes and first inductor patterns provided thereon, a fourth insulating sheet having sixth via-holes and second inductor patterns provided thereon, a fifth insulating sheet having seventh via-holes and first coupling capacitor patterns provided thereon, a sixth insulating sheet having third capacitor patterns provided thereon, a sixth insulating sheet having fourth capacitor patterns provided thereon, a seventh insulating sheet having second coupling capacitors provided thereon, an eighth insulating sheet having first shield patterns provided thereon, and a ninth insulating sheet having second shield patterns provided thereon.

6. The multi-layer composite electronic component according to claim 1, wherein the first through ninth insulating sheets are made of a mixture of a dielectric powder, a magnetic powder, and a binding agent.

7. The multi-layer composite electronic component according to claim 1, wherein the first and second inductor patterns and the first through fourth capacitor patterns are made of one of Ag, Pd, Cu, Au, or Ag—Pd.

8. The multi-layer composite electronic component according to claim 1, wherein the insulating sheets are stacked on each other in a stacking direction and the axes of the plurality of the inductors are substantially parallel to a stacking direction of the insulating sheets.

9. The multi-layer composite electronic component according to claim 1, wherein the plurality of inductors are arranged such that when currents flow through the plurality of inductors, magnetic fields that are substantially perpendicular to the axial direction of each of the plurality of inductors are generated around each of the inductors.

10. The multi-layer composite electronic component according to claim 1, further comprising a transmission terminal electrode and a reception terminal electrode provided on the right and left end surfaces of the multi-layer body.

11. The multi-layer composite electronic component according to claim 1, further comprising an antenna terminal electrode and ground terminal electrodes provided on the back surface of the multi-layer body, and ground terminal electrodes are provided on the front surface of the multi-layer body.

12. The multi-layer composite electronic component according to claim 11, further comprising a first and second band pass filter circuit, wherein signals input to the transmission terminal electrode are output to the antenna terminal electrode via the first band pass filter circuit, and signals input to the antenna terminal electrode are transmitted to the reception terminal electrode via the second band pass filter circuit and outputted.

13. The multi-layer composite electronic component according to claim 1, further comprising a first and second band pass filter circuit including inductors, wherein the axial directions of the inductors of the first band pass filter circuit are substantially perpendicular to the axial directions of the inductors of the second band pass filter circuit.

14. The multi-layer composite electronic component according to claim 13, wherein a magnetic field generated when currents flow through each of the inductors of the first band pass filter circuit is substantially perpendicular to a magnetic field generated when currents flow through each of the inductors of the second band pass filter circuit.

15. The multi-layer composite electronic component according to claim 1, wherein the component is a duplexer.

16. A multi-layer composite electronic component comprising:

a multi-layer body defined by a plurality of insulating layers, a plurality of inductor conductors, and a plurality of capacitor conductors;

a first band pass circuit having a plurality of LC resonators including a plurality of inductors defined by the inductor conductors and a plurality of capacitors defined by the capacitor conductors; and a second band pass circuit having a plurality of LC resonators including a plurality of inductors defined by the inductor conductors and a plurality of capacitors defined by the capacitor conductors;

wherein all of the inductors of the first high-frequency circuit are substantially perpendicular to all of the inductors of the second high-frequency circuit.

17. The multi-layer composite electronic component according to claim 16, further comprising a first three-stage band pass filter and a second three-stage band pass filter.

18. The multi-layer composite electronic component according to claim 16, wherein the first three-stage band pass filter includes at least three LC parallel resonators.

19. The multi-layer composite electronic component according to claim 16, where in the second three-stage band pass filter includes at least three LC parallel resonators.

20. The multi-layer composite electronic component according to claim 16, further comprising a first dummy insulating sheet having first via-holes provided thereon, a second dummy insulating sheet having second via-holes provided thereon, a first insulating sheet having third via-holes and first capacitor patterns provided thereon, a second insulating sheet having fourth via-holes and second capacitor patterns provided thereon, a third insulating sheet having fifth via-holes and first inductor patterns provided thereon, a fourth insulating sheet having sixth via-holes and second inductor patterns provided thereon, a fifth insulating sheet having seventh via-holes and first coupling capacitor patterns provided thereon, a sixth insulating sheet having third capacitor patterns provided thereon, a sixth insulating sheet having fourth capacitor patterns provided thereon, a seventh insulating sheet having second coupling capacitors provided thereon, an eighth insulating sheet having first shield patterns provided thereon, and a ninth insulating sheet having second shield patterns provided thereon.

21. The multi-layer composite electronic component according to claim 16, wherein the insulating sheets are stacked on each other in a stacking direction and the axes of the plurality of the inductors are substantially parallel to a stacking direction of the insulating sheets.

22. The multi-layer composite electronic component according to claim 16, wherein the plurality of inductors are arranged such that when currents flow through the plurality of inductors, magnetic fields that are substantially perpendicular to the axial direction of each of the plurality of inductors are generated around each of the inductors.

* * * * *